(12) United States Patent
Williams

(10) Patent No.: US 7,028,059 B2
(45) Date of Patent: Apr. 11, 2006

(54) APPARATUS AND METHOD FOR RANDOM NUMBER GENERATION

(75) Inventor: Emrys Williams, Milton Keynes (GB)

(73) Assignee: Sun Microsystems, Inc., Santa Clara, CA (US)

( * ) Notice: Subject to any disclaimer, the term of this patent is extended or adjusted under 35 U.S.C. 154(b) by 590 days.

(21) Appl. No.: 10/179,141

(22) Filed: Jun. 24, 2002

(65) Prior Publication Data
US 2003/0236803 A1     Dec. 25, 2003

(51) Int. Cl.
*G06F 1/02* (2006.01)
(52) U.S. Cl. ....................................... 708/250; 708/255
(58) Field of Classification Search ......... 708/250–256
See application file for complete search history.

(56) References Cited

U.S. PATENT DOCUMENTS

| | | | |
|---|---|---|---|
| 3,582,882 A * | 6/1971 | Titcomb et al. .......... | 340/146.2 |
| 5,627,775 A | 5/1997 | Hong et al. | |
| 6,104,810 A | 8/2000 | DeBellis et al. | |
| 6,240,432 B1 * | 5/2001 | Chuang et al. ............. | 708/252 |
| 6,249,009 B1 | 6/2001 | Kim et al. | |
| 6,253,223 B1 * | 6/2001 | Sprunk ....................... | 708/250 |
| 6,581,078 B1 | 6/2003 | Liardet | |
| 2003/0158876 A1 * | 8/2003 | Hars ........................... | 708/250 |

FOREIGN PATENT DOCUMENTS

WO          00/75761          12/2000

OTHER PUBLICATIONS

International search report application No. GB0313931.8 mailed Sep. 1, 2003.

\* cited by examiner

*Primary Examiner*—D. H. Malzahn
(74) *Attorney, Agent, or Firm*—Meyertons Hood Kivlin Kowert & Goetzel, P.C.; B. Noël Kivlin

(57) ABSTRACT

Apparatus is provided for reliably generating a random number sequence. The apparatus comprises a digital pseudo-random number sequence generator having a first output and an analog random number sequence generator having a second output. The pseudo-random number sequence on the first output and the random number sequence on the second output are combined using logic such as an exclusive-OR operation to generate an output number sequence.

20 Claims, 3 Drawing Sheets

APPARATUS AND METHOD FOR RANDOM NUMBER GENERATION

FIELD OF THE INVENTION

The present invention relates to an apparatus and method for the generation of random numbers in a robust and reliable manner, for use in computers and other electronic apparatus.

BACKGROUND OF THE INVENTION

Random numbers are needed in a range of computing applications. One major example is the use of random numbers as keys in cryptography. Thus many cryptographic algorithms, such as the Data Encryption Standard (DES), utilise a key as part of the encryption process. In the case of DES, the key is 56 bits in length. DES is an example of a symmetric algorithm, in which the original (clear) data can only be retrieved from the encrypted data by inputting the same key into the decryption algorithm. Other known encryption algorithms are asymmetric, in that the encryption and decryption keys are distinct (although related by certain mathematical properties), but again such algorithms may use random numbers to initially generate key pairs.

It will be appreciated that the safety of encrypted data is only as good as the safety of the key; if the key is compromised, then the clear data is accessible. One way in which this can potentially happen is if the supposedly random numbers used for key generation turn out not to be properly random, since this can make the keys predictable, or at least more easily breakable. (Indeed, this is reported to have happened with one particular version of the Netscape Navigator system, see http://www.counterpane.com/yarrow.html; Netscape and Navigator are trademarks of Netscape Communications Corporation).

There are many other applications besides cryptography that also make use of random numbers. These include, or example, electronic and computer games, to provide variety and unpredictability in the game, simulators for system testing to generate random input data and then to assess the output, and so on. Accordingly, nearly all computer systems are equipped with some kind of facility to provide random numbers.

The random number generators (RNGs) used in such systems can be classified into two main types, namely pseudo-random and truly random. The former category is typically based on digital electronic devices, such as a linear feedback shift register (LFSR), as illustrated in FIG. 1. In an LFSR, a series of flip-flops ($F_4$, $F_3$, $F_2$, and $F_1$) are interconnected via two-input exclusive-or (XOR) gates. A first input to each XOR gate is the output of the preceding flop, while the second input to each XOR gate comes from a feedback loop (top rail in FIG. 1), back from the output of the shift register.

The links between the XOR gates and the feedback loop are via respective connectors, $C_3$, $C_2$, and $C_1$ in FIG. 1. The behaviour of the shift register is altered according to whether these connectors are made open or shut. Although connectors $C_3$, $C_2$, and $C_1$ could in principle be implemented as switches to provide a configurable system, in most implementations they are hard-wired as open or shut. An example is shown in FIG. 1A, where $C_3$ and $C_1$ from FIG. 1 are complete, while $C_2$ is omitted. (For simplicity, FIG. 1A omits the XOR gate between flops $F_3$ and $F_2$, since this is redundant from a logic perspective, although in practice, for ease of construction, this XOR gate is likely to be present).

An LFSR can be represented by a polynomial, of order $X^n$, where n is the number of flops in the register. Thus the example of FIG. 1A can be denoted as: $x^4+x^3+1$. It will be appreciated that although the LFSRs in FIGS. 1 and 1A contain only 4 flops, most typical LFSRs will contains many more flops, for example 16, 32 or 64, and so will be represented by polynomials of appropriately higher order.

In use the LFSR is seeded with a certain pattern of values into the flops $F_4$, $F_3$, $F_2$, and $F_1$ (via a mechanism not shown in FIGS. 1 and 1A). Each clock input then causes these values to be shifted one flop along the register, in combination with the feedback signal (if connected for that flop), as well as producing an output from the final flop in the register, $F_1$. It is known that for certain LFSR polynomials, the LFSR contents will cycle through all 2n–1 possible values, where n is the number of flops in the register, before repetition. LFSRs having this property are said to have maximal length. Note that the only value that does not occur in such a sequence is all zeroes. (This value also cannot be used for the initial seeding, since in this case the register contents and output will remain at all zeroes throughout).

LFSRs (especially those having maximal length) can be used as pseudo-random number generators. This is because the output sequence of such an LFSR fulfils many of the statistical tests for random numbers (e.g. approximately even numbers of zeroes and ones, and so on). Further details about LFSRs can be obtained for example in "The Art of Electronics" (see Sections 9.32–9.37) by Horowitz and Hill, Cambridge University Press, 1989, (ISBN 0-521-37095-7).

The output sequence of such an LFSR is only pseudo-random, in that if the structure polynomial) of the LFSR is known, then the future output can be determined absolutely, once the position within the maximal length sequence has been identified. This represents a potential exposure in a cryptographic system, in that once a hacker obtains knowledge of the LFSR polynomial and the identity of a single key provided by this system, then all future keys can be predicted. (Some limited trial and error may be required, if the known key does not allow sequence position to be uniquely determined, but the search space and hence available security is greatly compromised in comparison with the original situation, where all possible keys would have to be investigated.

It is clearly desirable therefore to provide a random number generator that outputs a truly (rather than pseudo-) random number sequence. Unfortunately, it is not possible to generate truly random numbers using the main digital components of a computer system, since these are specifically intended to be deterministic (there would be serious problems if the output from the computer were not reproducible).

Internet Request for Comments (rfc) 1750 discusses this issue. Various mechanisms for possibly generating truly random numbers based on external events (such as mouse inputs, or disk drive properties) are contemplated. However, these are generally unsatisfactory in that they may be difficult to generate in sufficient quantity and at the required speed for some applications, and they may also be susceptible to outside interception and/or manipulation. In addition, their randomness cannot be absolutely ensured.

It is therefore known to incorporate analog random number generators into semiconductor devices. The output of such devices depends on some underlying parameter (thermodynamic, quantum, etc.) that behaves in an inherently statistical manner. The most common approach is utilise a noise source as the origin of the randomness, and then sample this with an analog-to-digital converter (ADC). One example of a suitable noise source is a Zener diode (as described in "Analog Circuits Cookbook" by I Hickman, Newnes, 1995, ISBN 0 7506 2002 1), while the random number generator of U.S. Pat. No. 5,961,577 uses Johnson (thermal) noise for the underlying source of randomness. Thermal noise has also been adopted as the basis for a random number generator within the Intel Pentium III processor (Intel and Pentium are trademarks of Intel Corporation), as described in "The Intel Random Number Generator", by B Jun and P Kocher, April 1999, available at http://www.cryptography.com/resources/whitepapers/Intel-RNG.pdf.

Unfortunately, it is much more difficult to incorporate analog random number generators into processors and other digital devices (in comparison with LFSRs, for example). This is because LFSRs and other pseudo-random number generators can be fabricated from standard digital components, and so can be easily integrated into CMOS semiconductor devices (or any other similar technology). In contrast, an analog random number generator is normally far less compatible with the general structure and design of these (digital) semiconductor devices.

These compatibility and fabrication problems can potentially manifest themselves in terms of reduced reliability for analog random number generators relative to LFSRs and similar digital devices. Of particular concern is the situation where an analog random number generator fails in the field. Note that such a failure may be only partial (for example certain bits in an output word may become stuck at a particular value). Such a degree of failure may not be immediately apparent, and so a cryptographic system may continue to produce keys using these "random" numbers. However, it will be appreciated that in such circumstances the security of the system has been compromised, potentially severely. For example, if a hacker were to become aware of the deficiency mentioned above, then this would reduce the search space necessary to try to break a key in a brute force trial and error attack.

SUMMARY OF THE INVENTION

Therefore, in accordance with one embodiment of the invention, there is provided an apparatus for generating a random number sequence. The apparatus comprises a digital pseudo-random number sequence generator having a first output; an analog random number sequence generator having a second output; and logic operable to perform a predetermined mixing function on the two outputs to generate the random number sequence. The predetermined mixing function is selected to combine the first and second outputs in such a manner as to generate the random number sequence, even if one of the first and second outputs has a non-random character. A variety of suitable mixing functions are known in the art. Generally the most straightforward one to implement in digital logic is a simple exclusive-OR (XOR) function (or its inverse).

The above approach offers improved reliability and robustness over prior art devices that use either a single analog or digital random number sequence generator. Thus even if the analog or digital generator in the above apparatus were to fail, the mixing logic would still ensure that the output from the apparatus properly represented a random number sequence.

It will also be appreciated that the above approach goes beyond mere redundancy (i.e. the provision of two identical components, with one acting as a backup for the other), by specifically utilising two different forms of generator. Thus an apparatus that simply included two digital generators might have reasonable reliability, using one generator as a fail-safe for the other, but would be limited in output to only pseudo-random (rather than truly random) numbers, even when fully operational. On the other hand, an apparatus that simply included two analog generators might not provide sufficient reliability, for the fabrication reasons discussed above.

In contrast, the approach of the present invention offers a combination of truly random output when fully operational, yet maintains high reliability. Thus in the most likely failure mode, where the analog generator develops a fault, the output from the apparatus will only be slightly degraded from a truly random number sequence into a pseudo-random number sequence, as produced by the digital generator. It will be appreciated that this output of the pseudo-random number sequence represents only a marginal downgrade, and will be acceptable for a limited period in which to repair or replace the apparatus.

A further consideration is that the analog and digital generators will typically be quite different from one another in terms of underlying physical construction (indeed, this is the primary difficulty with the use of analog generators in the first place). On the other hand, this also means that they have somewhat different vulnerabilities to potential exposures such as heat, impurities, and so on. Consequently, the possibility of a joint failure is likely to be lower with two such heterogeneous generators (compared to the situation with two physically similar generators). Moreover, the difference between the two generators minimises any risk of correlation between their two outputs, which is the one thing that could jeopardise the proper operation of the mixing logic.

It will be appreciated that the mixing logic does represent a single point of failure, although if implemented by something as simple as an XOR gate this would not be expected to be a frequent mode of failure at all. Nevertheless, the mixing logic can be duplicated if so desired to provide increased redundancy, with each copy of the logic generating a random number sequence from the first and second outputs. The overall output of the apparatus can then be taken from either copy of the logic. In addition, a comparison can be made of the output from each copy to confirm that both copies are still operating properly.

In one particular embodiment, the digital pseudo-random number sequence generator comprises a linear feedback shift register. Such registers have the advantage of being easy to fabricate using standard technology, especially for integration into larger digital devices and also have well-understood mathematical properties. Nevertheless, other forms of digital pseudo-random number sequence generators are also known in the literature, and may be employed according to the relevant circumstances.

The analog random number sequence generator can be any suitable device or component available in the art for producing a truly random number sequence. Examples are circuits based on a Zener diode or thermal noise, as discussed above. Note that such generators are often in fact constructed (at least partly) from digital components. Nevertheless, they can still be regarded as analog in the sense that they rely on some analog physical effect (such as radioactivity, thermal noise, etc.) for providing their underlying random behaviour.

In one particular embodiment, the first and second outputs are separately monitored in order to ensure that they each properly represent a random number sequence. Thus if either the digital or analog random number sequence generator fails, the apparatus is now operating with no safety margin, in that the failure of the other generator would cause the output (if any) to be non-random. The use of the monitors to detect the initial failure of one of the generators allows this situation to be quickly recognised, and appropriate remedial action then taken to promptly restore the desired safety margin. This may for example involve repair or replacement of the failed generator, or perhaps more probably replacement of the whole apparatus. Such total replacement is particularly likely where, as will often be the case, the apparatus is formed on/in a single semiconductor device, such as a processor or application specific integrated circuit (ASIC). In the latter circumstance, the purpose of the device may simply be to act as a reliable random number generator for some larger system (component), or the device may have a broader overall function that includes a requirement for random numbers.

In accordance with another embodiment of the invention, there is provided a method for generating a random number sequence comprising the steps of: using a digital subsystem to produce a first pseudo-random number sequence; using an analog subsystem to produce a second random number sequence; and performing a predetermined logical mixing function on the first and second random number sequences in order to generate an output random number sequence. Again, the predetermined mixing function can be selected to combine the first and second outputs in such a manner as to generate the random number sequence, even if one of the first and second outputs has a non-random character.

It will be appreciated that such a method can generally benefit from the same particular features as described above in relation to the apparatus embodiments.

BRIEF DESCRIPTION OF THE DRAWINGS

Various embodiments of the invention will now be described in detail by way of example only with reference to the following drawings in which like reference numerals pertain to like elements and in which.

DETAILED DESCRIPTION

Figure 1:
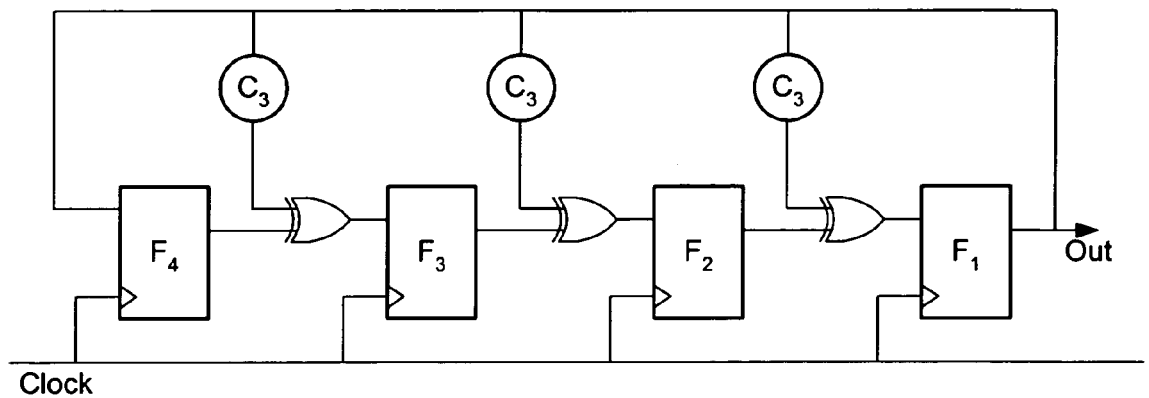
FIG. 1 is a schematic diagram of a prior art linear feedback shift register.
Figure 1A:
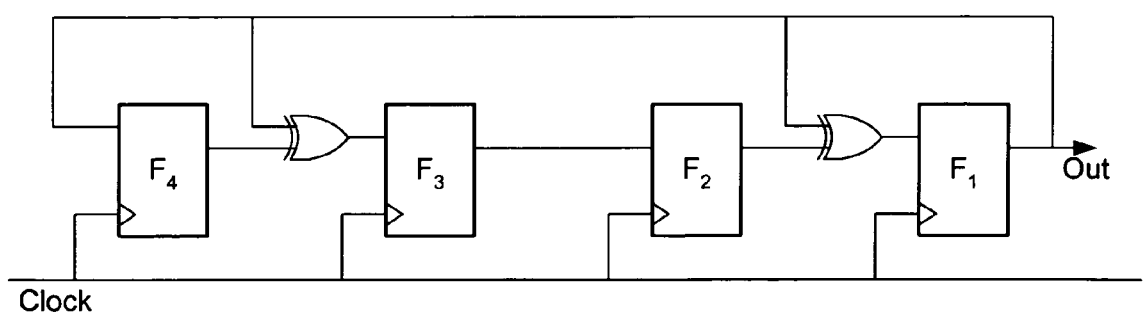
FIG. 1A is a schematic diagram of a particular embodiment of a prior art linear feedback shift register.
Figure 2:
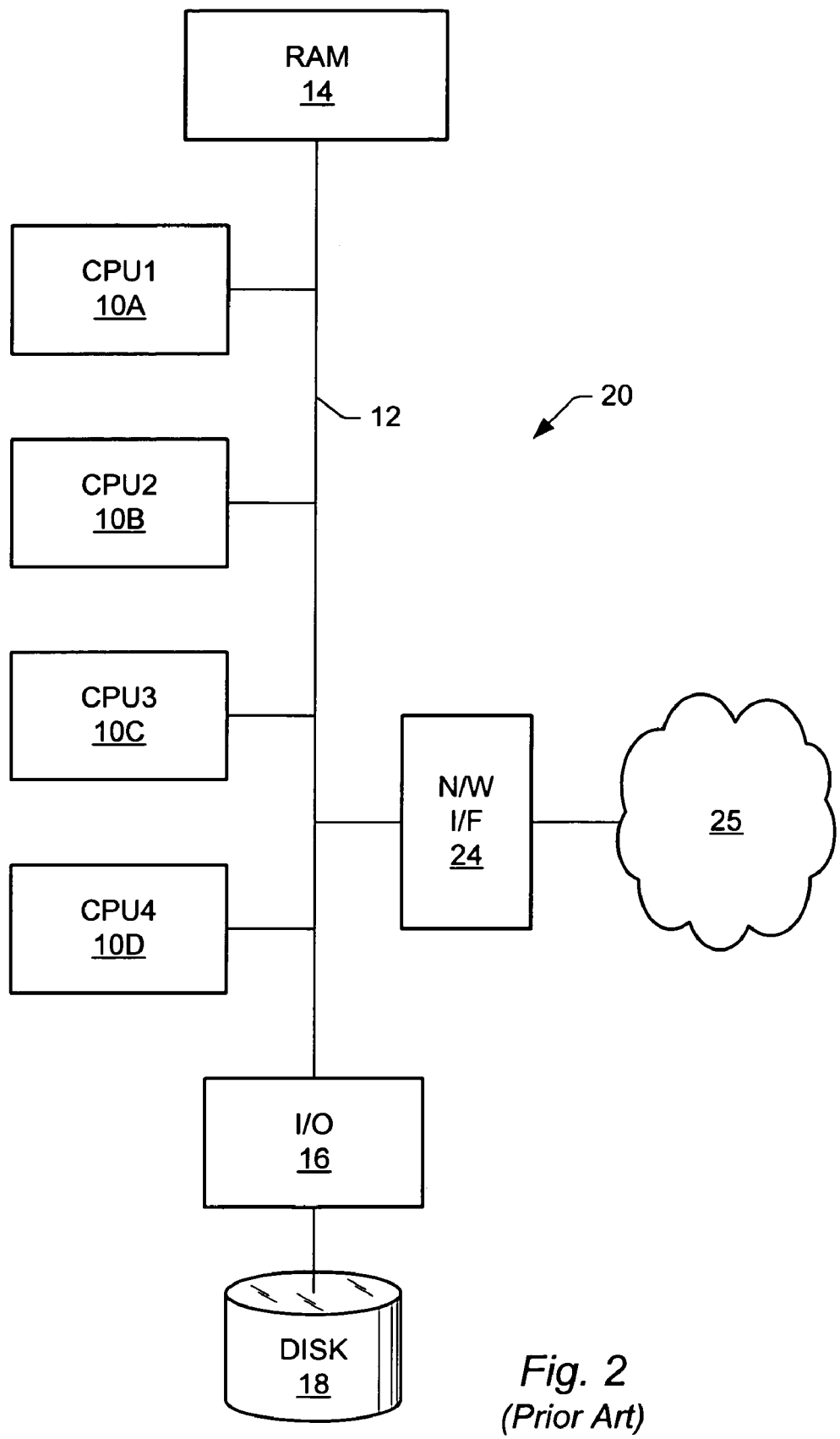
FIG. 2 is a high-level diagram of a computing system.

FIG. 2 is a simplified schematic diagram of a typical (known) multi-processor system 20. System 20 includes four CPUs 10A, B, C and D (although of course more or fewer CPUs may be included in other embodiments). Each of these includes a processor (such as a SPARC processor from Sun Microsystems Inc), with associated registers, cache memory, and other components. The CPUs 10 are interconnected by bus 12, which also links them to shared physical memory, RAM 14. The CPUs 10 are further attached via interface 16 to external disk storage 18. This may typically be provided by multiple disk drives, for example as arranged into a redundant array of inexpensive drives (RAID) architecture. Bus 12 is also connected to network interface 24 in order to allow system 20 to communicate via network 25. It will be appreciated that the computer system shown in FIG. 2 is purely illustrative, and a very wide variety of other possible configurations and sets of components are well-known in the art.

Figure 3:
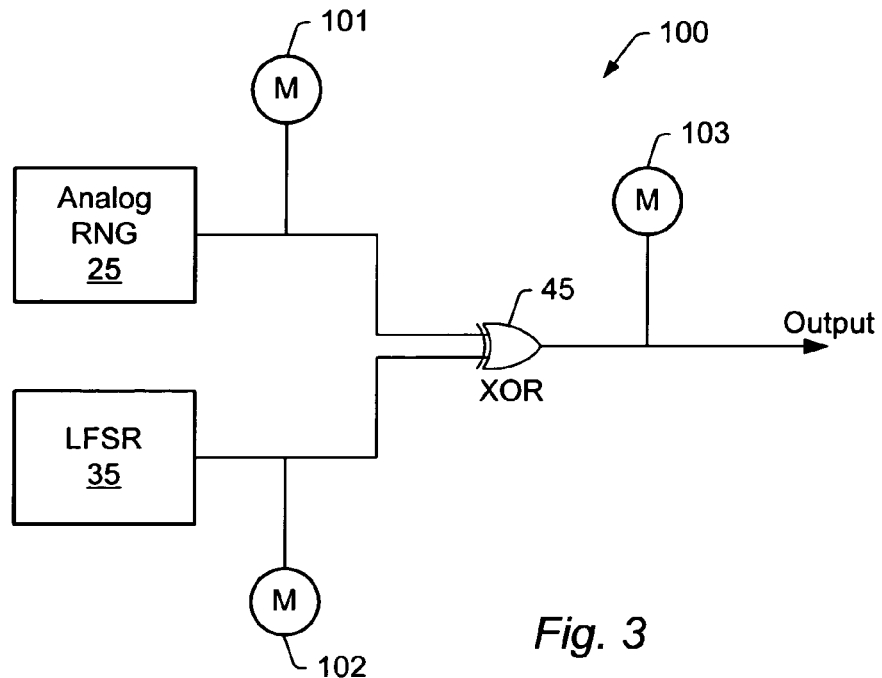
FIG. 3 is a block diagram of a random number generation unit in accordance with one embodiment of the present invention, for use in the system of FIG. 2 and elsewhere.

FIG. 3 is a schematic block diagram of a random number generation unit 100 in accordance with one embodiment of the invention, which may be used in the system of FIG. 2. For example, the unit may be incorporated at a semiconductor device level into a processor 10A, B, C or D. The unit may also be included in network interface system 24 or input/output system 16, for example to generate keys for encrypted data transmission or storage, respectively. Note that unit 100 may be included as a portion of a larger semiconductor device, such as a processor or application specific integrated circuit (ASIC), or unit 100 may be fabricated as a discrete semiconductor device itself. Further possible uses of the random number generator of FIG. 3 will be apparent to those skilled in the art.

As shown in FIG. 3, random number generator unit 100 comprises two main subsystems. The first subsystem 25 is an analog random number generator, such as one based on using thermal noise to control a set of oscillators. This subsystem, when operating correctly, generates a truly random sequence of numbers. The second subsystem 35 in unit 100 is a linear feedback shift register (LFSR) 35. This is used to generate a pseudo-random number sequence.

It will be appreciated that suitable devices for forming subsystems 25 and 35 on an individual basis are well-known in the art (as described above), and so they will not be further detailed herein. In addition, note that there are other known approaches for generating a sequence of pseudo-random numbers that could be employed in subsystem 35, apart from the use of an LFSR. For example, such a sequence may be derived from a transcendental number such as e, which can be digitally calculated as the sum of 1+Sum(1/N!). Other possibilities are also described in the literature, see for example Chapter 6 on pseudo-random testing in "Fault Diagnosis of Digital Circuits" by V Yarmolik, Wiley 1990 (ISBN 0 471 92680 9).

The outputs from the analog random number generator 25 and the LFSR 35 are fed into a two input exclusive-OR (XOR) gate 45. The output from this XOR gate 45 then represents the output from the random number generator unit 100. XOR gate 45 provides a mixing function to combine the output sequence from the analog random number generator 25 with the output sequence from the LFSR 35. The mathematical properties of the XOR operation are such that the output of the XOR gate 45 will be a (truly) random number sequence, providing: (a) one of its two inputs is a (truly) random sequence; and (b) there is no correlation between the two inputs. (In fact, by building a hierarchy of XOR gates, these results can be extended to an arbitrary number of inputs).

Other mixing functions are known that share the above mathematical properties. Some of these offer stronger mixing, in particular, they are less vulnerable to correlation between the two inputs than the XOR operation. One example of a strong mixing function is the above-mentioned DES, which can take up to 120 bits of input (a 56-bit "key" and 64 bits of "data"), and produce an output from this of 64 bits of data. These output bits have a complex non-linear dependency on the full set of input bits. To utilise DES in unit 100, the outputs from the two subsystems 25, 35 would be combined as the input bits, with the DES output then representing the overall (mixed) output from unit 100. Note that other mixing functions, such as the Secure Hashing Algorithm (SHA), are also known in the literature (see the above-referenced paper by Jun and Kocher, and also rfc1750).

An important consequence of using a mixing function, such as provided by XOR 45, which has a random output as long as at least one of its inputs is random, is that random number generator unit 100 is robust in the event of subsystem failure. Thus consider what happens if LFSR 35 were to fail in some manner, so that it no longer generated a pseudo-random sequence. In this case the output from LFSR 35 might simply be a constant sequence of bits, although normally a more complicated (but still non-random) sequence would result. Nevertheless, due to the mathematical properties of the XOR operation mentioned above, the output from XOR gate 45 will remain as a truly random number sequence, despite the failure of LFSR 35. Accordingly, system 100 is robust against failure of the LFSR 35 component.

In practice, due to the fabrication issues explained above, we would actually expect LFSR 35 to be the more reliable of the two subsystems in unit 100, with a malfunction of analog random number generator subsystem 25 being the most likely failure mode. In this situation, the above-mentioned mathematical properties of the XOR operation ensure that the output from the XOR gate 35 now becomes a pseudo-random number sequence, by virtue of the fact that one of the inputs, namely that from LFSR 35, is itself a pseudo-random number sequence.

It can be seen therefore that by utilising two dissimilar random number generator subsystems 25 and 35, unit 100 enjoys a combination of good output properties (i.e. it produces a truly random sequence), with a high degree of robustness. Thus in the most probable failure mode, namely a malfunction within the analog subsystem 25, there is only a marginal (rather than catastrophic) decrease in performance, in that unit 100 will now output a pseudo-random number sequence rather than a truly random number sequence. It will be appreciated that this pseudo-random number generation should provide adequate security for the limited period of time needed for the failure of subsystem 25 to be detected and corrected.

The above behaviour is based on two assumptions, both justified from an engineering perspective. The first assumption is that the outputs from the two subsystems 25, 35 will not be correlated in any way. This is necessary in view of the mathematical properties of the XOR function, since (for example), if the two output sequences happened to be identical, then the unit would produce a string of zeroes. Given that the two subsystems are independently constructed and have quite different modes of operation, there is a sound physical basis why their outputs will not be correlated with one another.

The second assumption is that only one of the subsystems fails at a given time. It will be appreciated that as long as the individual subsystems 25, 35 are made reasonably reliable, the probability of a simultaneous failure of both becomes extremely small. Note that this is helped by the underlying dissimilar nature of the two devices, since their particular vulnerabilities to potentially shared exposures (e.g. to high humidity increased temperature, etc) are likely to be different.

Of course, if a subsystem does happen to fail, then it is important to be able to detect this in order to allow repair or replacement of the unit before failure of the other subsystem. Unit 100 therefore includes three monitors 101, 102, 103, as depicted in FIG. 3 that are used to check the signals on the lines to which they are attached in order to verify that the relevant signals are indeed properly random. This monitoring can be performed using known statistical tests, for example, by looking at the auto-correlation properties of the sequence (see the above-mentioned paper by Jun and Kocher for a discussion of various possible tests).

If monitor 101 or monitor 102 does trigger an alert that the relevant number sequence is no longer properly random, then this implies that the relevant subsystem is malfunctioning. Consequently, the failed subsystem (or possibly the whole unit 100) needs to be repaired or replaced, in order that the desired operational safety margin can be restored. Note that except in the most blatant cases, it may take some time for a monitor to realise that the relevant number sequence is no longer random, since this will require enough data samples for the non-randomness to become statistically significant. This factor underlines the advantage described above, whereby the unit 100 continues to output pseudo-random numbers (at least) even if one of the subsystems 25, 35 fails. This therefore allows time for the malfunction of a subsystem to be detected by monitor 101, 102, without the proper operation of the unit overall being substantially impaired prior to such detection (and ensuing corrective action).

Monitor 103 verifies that the overall output from system 100 does indeed comprise a random number sequence (whether truly random or just pseudo-random). If monitor 103 indicates a failure, without a failure also having been indicated by monitor 101 and monitor 102, then this implies a failure of XOR gate 45 or an associated connecting line. It will be appreciated that this is expected to be a very rare failure mode due to the simplicity of XOR gate 45 compared to the two subsystems 23, 35.

One way to counter against possible failure of XOR gate 45 is to duplicate this part of the system in order to provide a certain degree of redundancy. An embodiment using this approach is illustrated by the random number generator unit 100A depicted in FIG. 4. (Note that the general functionality of the various components in FIG. 4 corresponds to that of the embodiment shown in FIG. 3, and so will not be described in detail).

Figure 4:
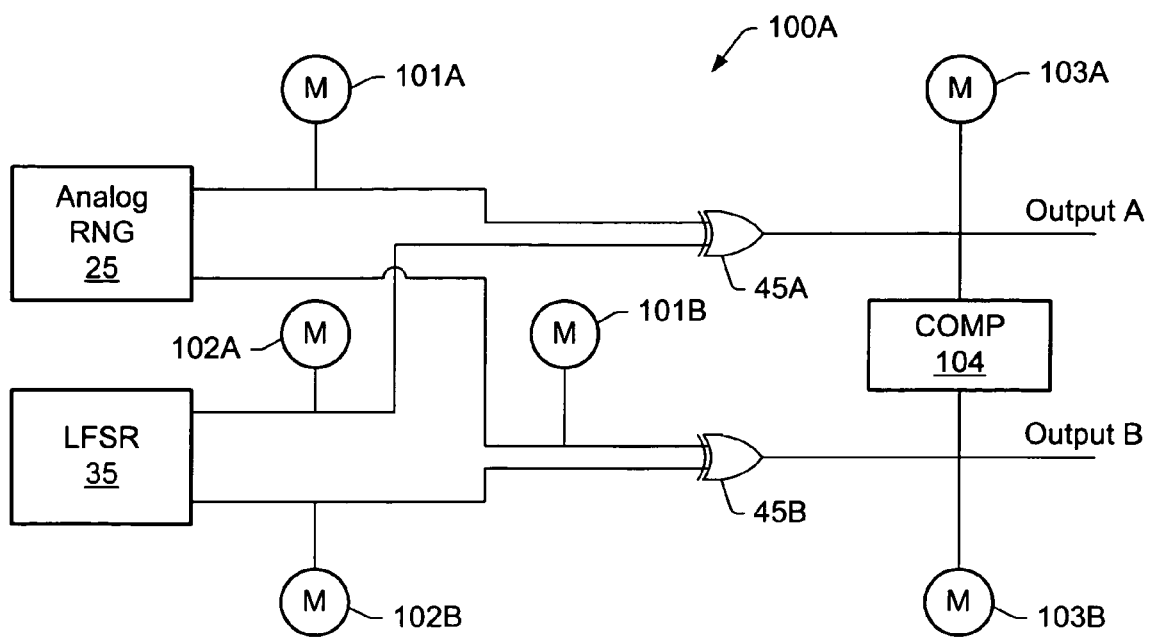
FIG. 4 is a block diagram of a modification of the embodiment of FIG. 3 that has increased redundancy.

In the embodiment of FIG. 4, a pair of outputs is taken from each of the two subsystems 25 and 35. One output from each pair is directed to a first XOR gate 45A, and the second output from each pair is directed to a second XOR gate 45B. The, monitors are also duplicated in this embodiment, so that monitors 101A and 101B check the two outputs from subsystem 25, while monitors 102A and 102B check the two outputs from the subsystem 35. Similarly, monitor 103A checks output A from XOR gate 45A, while monitor 103B checks output B from XOR gate 45B. Note that some consolidation of this monitoring may be desirable, such as combining monitors 101A, 102A and 103A into one unit, and monitors 101B, 102B, and 103B into a second unit (although this does not detract from the fact that there are six different lines to be monitored).

As a further precaution, the outputs from the two XOR gates 45A, B are directed to a comparator 104. This confirms that the two XOR gates are indeed producing the same output as each other. It will be appreciated that should this not be the case, this represents an immediate indication that there is an error somewhere in the system.

In the embodiment of FIG. 4, the system output is taken from one of the XOR gates 45A, B for as long as that XOR gate is indicated as being properly operational. If, however, for any reason, the monitor associated with that XOR gate indicates a failure of that particular XOR gate or its associated connections, then the output can now be taken from the other XOR gate. Of course, it will be appreciated that more sophisticated general output strategies could be employed for unit 100A, for example using outputs A and B alternatively, or in combination with one another. In the latter case, the comparator 104 could be used to provide a valid signal, as long as the outputs A and B correctly matched one another.

Although a random number generator unit in accordance with the present invention has been described primarily in the context of computer systems, it will be recognised that it can be employed in semiconductor devices for use in a very wide variety of systems. Thus there is a large number of situations where a sequence of electronically generated random numbers may be desired and where a random number generator unit in accordance with the present invention may be utilised. These include, for example, gaming consoles, mobile telephones (to generate keys for secure communications), industrial testing and simulation systems, and so on.

Thus while a variety of particular embodiments have been described in detail herein, it will be appreciated that this is by way of exemplification only. The skilled person will be aware of many further potential modifications and adaptations that fall within the scope of the claimed invention and its equivalents.

The invention claimed is:

1. An apparatus comprising:
   a digital pseudo-random number sequence generator configured to generate a first output;
   an analog random number sequence generator configured to generate a second output, wherein said first output is generated independently of said second output; and
   logic operable to perform a predetermined mixing function on said first and second outputs to generate said random number sequence, wherein said predetermined mixing function combines said first and second outputs in such a manner as to generate a random number sequence, even if one of said first and second outputs has a non-random character.

2. The apparatus of claim 1, wherein said logic comprises an exclusive-OR gate.

3. The apparatus of claim 1, wherein said digital pseudo-random number sequence generator comprises a linear feedback shift register.

4. The apparatus of claim 1, wherein said first and second outputs are separately monitored to ensure that they each represent a random number sequence.

5. The apparatus of claim 1, wherein said logic is duplicated, and each copy of the logic generates a random number sequence from said first and second outputs.

6. A semiconductor device comprising:
   a digital pseudo-random number sequence generator configured to generate a first output;
   an analog random number sequence generator configured to generate a second output, wherein said first output is generated independently of said second output; and
   logic operable to perform a predetermined mixing function on said first and second outputs to generate said random number sequence, wherein said predetermined mixing function combines said first and second outputs in such a manner as to generate a random number sequence, even if one of said first and second outputs has a non-random character.

7. The semiconductor device of claim 6, wherein said logic, comprises an exclusive-OR gate.

8. The semiconductor device of claim 6, wherein said digital pseudo-random number sequence generator comprises a linear feedback shift register.

9. The semiconductor device of claim 6, wherein said first and second outputs are separately monitored to ensure that they each represent a random number sequence.

10. The semiconductor device of claim 6, wherein said logic is duplicated, and each copy of the logic generates a random number sequence from said first and second outputs.

11. An apparatus comprising:
    digital means for generating a first pseudo-random number sequence;
    analog means for generating a second random number sequence, wherein said first random number sequence is generated independently of said second random number sequence; and
    logic means for performing a predetermined mixing function on said first and second random number sequences in order to generate an output random number sequence.

12. A method for generating a random number sequence comprising the steps of:
    using a digital subsystem to produce a first pseudo-random number sequence;
    using an analog subsystem to produce a second random number sequence, wherein said first pseudo-random number sequence is generated independently of said second random number sequence; and
    performing a predetermined logical mixing function on said first and second random number sequences in order to generate an output random number sequence, wherein said predetermined logical mixing function combines said first and second random number sequences in such a manner as to generate said output random number sequence, even if one of said first and second random number sequences has a non-random character.

13. The method of claim 12, wherein said predetermined logical mixing function comprises an exclusive-OR operation.

14. The method of claim 12, wherein a linear feedback shift register is used to generate said first pseudo-random number sequence.

15. The method of 12 further comprising the step of separately monitoring said first and second random number sequences to ensure that they each properly represent a random number sequence.

16. The method of claim 12, further comprising the step of duplicating said predetermined logic function.

17. An apparatus comprising:
    a digital pseudo-random number sequence generator configured to generate a first output and a second output;
    an analog random number sequence generator configured to generate a third output and a fourth output;
    first logic operable to perform a first predetermined mixing function on the first and third outputs to generate the first random number sequence, wherein the first predetermined mixing function combines the first and second outputs in such a manner as to generate a first random number sequence, even if one of the first and third outputs has a non-random character
    second logic operable to perform a second predetermined mixing function on the second and fourth outputs to generate said second random number sequence, wherein the second predetermined mixing function combines said second and fourth outputs in such a manner as to generate a second random number sequence, even if one of the second and fourth outputs has a non-random character; and a comparator coupled to receive the first and second random number sequences and configured to determine whether the first random number sequence is the same as the second random number sequence.

18. The apparatus of claim 17, wherein the first logic comprises a first exclusive-OR gate and the second logic function comprises a second exclusive-OR gate.

19. The apparatus of claim 17, wherein the digital pseudo-random number generator is a linear feedback shift register.

20. The apparatus of claim 17, wherein the first, second, third, and fourth outputs are separately monitored to ensure that they each represent a random number sequence.

* * * * *